(12) United States Patent
Houston

(10) Patent No.: US 6,597,610 B2
(45) Date of Patent: Jul. 22, 2003

(54) SYSTEM AND METHOD FOR PROVIDING STABILITY FOR A LOW POWER STATIC RANDOM ACCESS MEMORY CELL

(75) Inventor: Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/999,030

(22) Filed: Oct. 25, 2001

(65) Prior Publication Data

US 2003/0007380 A1 Jan. 9, 2003

Related U.S. Application Data

(60) Provisional application No. 60/258,819, filed on Dec. 29, 2000.

(51) Int. Cl.[7] .................................................. G11C 7/00
(52) U.S. Cl. .............. 365/201; 365/230.06; 365/189.09
(58) Field of Search ........................... 365/201, 230.06, 365/189.09, 189.11, 208

(56) References Cited

U.S. PATENT DOCUMENTS 5,396,464 A * 3/1995 Slemmer ................ 365/189.01
5,450,362 A * 9/1995 Matsuzaki ................... 365/201

* cited by examiner

Primary Examiner—David Lam
(74) Attorney, Agent, or Firm—Wade James Brady, III; Frederick J. Telecky, Jr.

(57) ABSTRACT

A system for providing stability for a low power static random access memory (SRAM) cell (10) is provided that includes a wordline (14), a driver (34) and a mode selector (36). The wordline (14) is coupled to the SRAM cell (10). The wordline (14) is operable to select the SRAM cell (10) for read and write operations when activated and to de-select the SRAM cell (10) when de-activated. The driver (34) is coupled to the wordline. The driver (34) is operable to activate and de-activate the wordline (14). The mode selector (36) is coupled to the driver (34). The mode selector (36) is operable to provide a mode signal (44) to the driver (34) to place the wordline (14) into one of a plurality of modes.

20 Claims, 2 Drawing Sheets

SYSTEM AND METHOD FOR PROVIDING STABILITY FOR A LOW POWER STATIC RANDOM ACCESS MEMORY CELL

This application claims priority under 35 USC §119(e)(1) of provisional application No. 60/258,819 filed Dec. 29, 2000.

TECHNICAL FIELD OF THE INVENTION

This invention relates generally to digital memory systems and more particularly to a system and method for providing stability for a low power static random access memory cell.

BACKGROUND OF THE INVENTION

Modern electronic equipment such as televisions, telephones, radios and computers are generally constructed of solid state devices. Integrated circuits are preferred in electronic equipment because they are extremely small and relatively inexpensive. Additionally, integrated circuits are very reliable because they have no moving parts, but are based on the movement of charge carriers.

Integrated circuits may include transistors, capacitors, resistors and other semiconductor devices. Typically, such devices are fabricated on a substrate and interconnected to form memory arrays, logic structures, timers and other components of an integrated circuit. One type of memory array is a static random access memory (SRAM) in which memory cells are continuously available for reading and writing data. As technology improves, SRAM cells and other components are designed to operate at lower supply voltages.

In some SRAM cells, high threshold voltage n-channel transistors are used to ensure data retention. However, for SRAM cells operating at relatively low supply voltages, using high threshold voltage n-channel transistors may result in the SRAM cells becoming unstable during a read operation.

SUMMARY OF THE INVENTION

In accordance with the present invention, a system and method for providing stability for a low power static random access memory (SRAM) cell are provided that substantially eliminate or reduce disadvantages and problems associated with previously developed systems and methods. In particular, the present invention provides an SRAM cell with high threshold voltage n-channel transistors to ensure data retention and a limited wordline voltage swing to ensure stability during read operations.

In one embodiment of the present invention, a system for providing stability for a low power SRAM cell is provided that includes a wordline, a driver and a mode selector. The wordline is coupled to the SRAM cell. The wordline is operable to select the SRAM cell for read and write operations when activated and to de-select the SRAM cell when de-activated. The driver is coupled to the wordline. The driver is operable to activate and de-activate the wordline. The mode selector is coupled to the driver. The mode selector is operable to provide a mode signal to the driver to place the wordline into one of a plurality of modes.

In another embodiment of the present invention, a method for providing stability for a low power SRAM cell is provided. A wordline is coupled to the SRAM cell. The wordline is operable to select the SRAM cell for read and write operations when activated and to de-select the SRAM cell when de-activated. A driver is coupled to the wordline. The driver is operable to activate and de-activate the wordline. A mode selection is received for the wordline. A mode signal is provided to the driver based on the received mode selection. The wordline is placed into one of a plurality of modes based on the mode signal.

In yet another embodiment of the present invention, a method for providing stability for a low power SRAM cell is provided. A wordline is coupled to the SRAM cell. The wordline is operable to select the SRAM cell for read and write operations when activated and to deselect the SRAM cell when de-activated. A driver is coupled to the wordline. The driver is operable to activate and de-activate the wordline. A stability level is monitored for the SRAM cell. A mode signal is provided to the driver based on the stability level for the SRAM cell. The wordline is placed into one of a plurality of modes based on the mode signal.

Technical advantages of the present invention include providing an improved low power SRAM cell. In a particular embodiment, the SRAM cell includes high threshold voltage n-channel transistors, in addition to a wordline driver that is operable to limit the wordline voltage swing during low power operating conditions and allow a full wordline voltage swing otherwise. As a result, data retention and stability during read operations are ensured for the SRAM cell during low power operating conditions, while performance during normal operating conditions is unaffected. Accordingly, the SRAM cell functions properly under low power testing conditions, as well as under normal operating conditions.

Other technical advantages will be readily apparent to one skilled in the art from the following figures, description, and claims.

BRIEF DESCRIPTION OF THE DRAWINGS

For a more complete understanding of the present invention and its advantages, reference is now made to the following description taken in conjunction with the accompanying drawings, wherein like numerals represent like parts, in which.

DETAILED DESCRIPTION OF THE INVENTION

Figure 1:
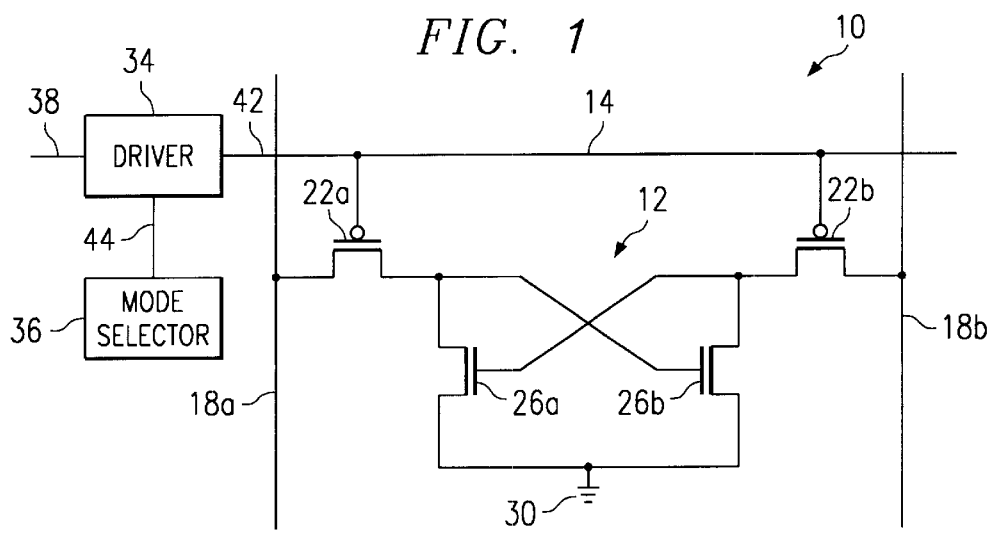
FIG. 1 is a schematic diagram illustrating a low power static random access memory (SRAM) cell in accordance with one embodiment of the present invention.

FIG. 1 is a schematic diagram illustrating a low power static random access memory (SRAM) cell 10 in accordance with one embodiment of the present invention. The SRAM cell 10 may be part of a memory array formed on an integrated circuit. In operation, the cell 10 is operable to store data without being externally refreshed as long as power is supplied to the cell 10.

The SRAM cell 10 is operable to store a bit of data and is coupled to a wordline 14, a bitline 18a and an inverted bitline 18b. These lines 14 and 18 may be used to select the cell 10 for reading the bit of data currently stored in the cell 10 or for writing a bit of data to the cell 10. The value of the bit of data stored in the SRAM cell 10 may be accessed by activating the wordline 14 and sensing the voltages on the bitline 18a and the inverted bitline 18b.

The SRAM cell 10 comprises a plurality of transistors 22 and 26. According to the illustrated embodiment, transistors 22 comprise p-channel, pass transistors and transistors 26 comprise n-channel, drive transistors. The pass transistor 22a is coupled to the wordline 14 and the bitline 18a, and the pass transistor 22b is coupled to the wordline 14 and the inverted bitline 18b. The drive transistors 26 are coupled to the pass transistors 22 and to ground 30. The drive transistors 26 comprise high threshold voltage transistors to ensure data retention for the SRAM cell 10.

The SRAM cell 10 also comprises a driver 34 for activating and de-activating the wordline 14 and a mode selector 36 for placing the wordline 14 into one of a plurality of modes. The driver 34 may comprise an inverter or other suitable component operable to receive an input signal on line 38 and to provide an output signal on line 42 to activate or de-activate the wordline 14 in accordance with the input signal. Thus, for the embodiment in which the driver 34 comprises an inverter, a high input signal on line 38 results in a low output signal on line 42 which activates the wordline 14 by turning on the pass transistors 22. Similarly, a low input signal on line 38 results in a high output signal on line 42 which de-activates the wordline 14 by turning off the pass transistors 22.

The mode selector 36 is operable to provide a mode signal on line 44 to the driver 34 to place the wordline 14 into one of a plurality of modes. Thus, for example, the mode selector 36 may provide a normal mode signal on line 44 to place the wordline 14 into a normal mode and a test mode signal on line 44 to place the wordline 14 into a test mode. As described in more detail below in connection with FIGS. 4 and 5, the mode selector 36 may receive a mode selection for the wordline 14 from a source external to the SRAM cell 10 or the mode selector 36 may comprise an on-chip detector for determining a mode selection for the wordline 14.

Figure 2A:
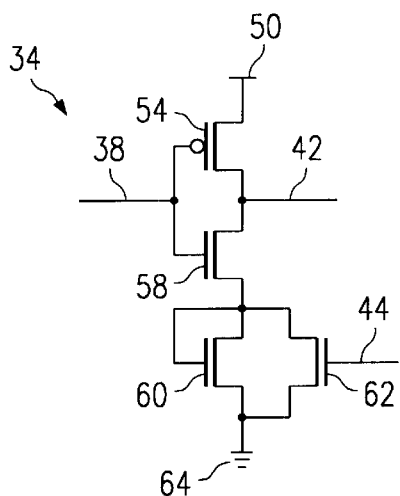
FIGS. 2A–B are schematic diagrams illustrating the driver of FIG. 1 in accordance with alternative embodiments of the present invention.
Figure 2B:
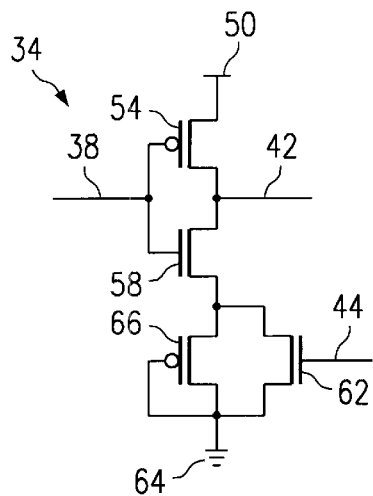

FIGS. 2A–B are schematic diagrams illustrating the driver 34 in accordance with alternative embodiments of the present invention. According to both embodiments, the driver 34 comprises a p-channel transistor 54 and an n-channel transistor 58 coupled together in an inverter configuration. Thus, for an input signal on line 38 that is low, the output signal on line 42 corresponds to the voltage of the power supply 50, which is high. Similarly, for an input signal on line 38 that is high, the output signal on line 42 corresponds to the voltage at the source node of the n-channel transistor 58, which is low. Both embodiments of the driver 34 also comprise an n-channel transistor 62 for switching the wordline 14 between a normal mode and a test mode based on the mode signal received on line 44.

For the embodiment shown in FIG. 2A, the driver 34 comprises an n-channel transistor 60 that is coupled in parallel with the n-channel transistor 62. The gate of the n-channel transistor 60 is coupled to the drain of the n-channel transistor 60. For the embodiment shown in FIG. 2B, the driver 34 comprises a p-channel transistor 66 that is coupled in parallel with the n-channel transistor 62. The gate of the p-channel transistor 66 is coupled to ground 64.

In operation, for both embodiments, when the mode signal on line 44 is high, indicating that the wordline 14 is in the normal mode, the n-channel transistor 62 is activated. This provides a path from the source node of the n-channel transistor 58 to ground 64. In this situation, the output signal on line 42 is substantially the same as ground 64. Thus, a full wordline voltage swing is provided from the power supply 50 to ground 64 when the wordline 14 is in the normal mode.

For the embodiment shown in FIG. 2A, when the mode signal on line 44 is low, indicating that the wordline 14 is in the test mode, the n-channel transistor 62 is de-activated. This blocks the path from the source node of the n-channel transistor 58 to ground 64 through the n-channel transistor 62. In this situation, the output signal on line 42 is determined by the n-channel transistor 60 which prevents the source node of the n-channel transistor 58 from dropping below a specified level based on the threshold voltage of the n-channel transistor 60. Thus, a limited wordline voltage swing is provided from the power supply 50 to a specified level greater than ground 64 when the wordline 14 is in the test mode.

For the embodiment shown in FIG. 2A, when the mode signal on line 44 is low, indicating that the wordline 14 is in the test mode, the n-channel transistor 62 is de-activated. This blocks the path from the source node of the n-channel transistor 58 to ground 64 through the n-channel transistor 62. In this situation, the output signal on line 42 is determined by the p-channel transistor 66 which prevents the source node of the n-channel transistor 58 from dropping below a specified level based on the threshold voltage of the p-channel transistor 66. Thus, a limited wordline voltage swing is provided from the power supply 50 to a specified level greater than ground 64 when the wordline 14 is in the test mode.

Figure 3A:
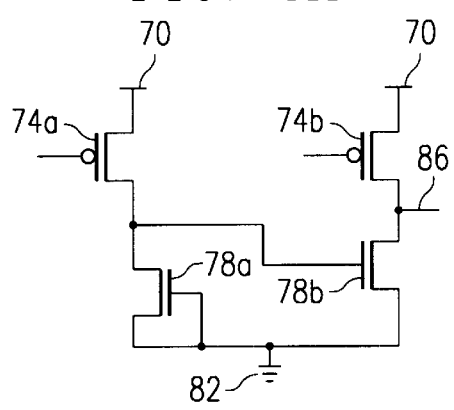
FIGS. 3A–C are schematic diagrams illustrating the mode selector of FIG. 1 in accordance with alternative embodiments of the present invention.
Figure 3B:
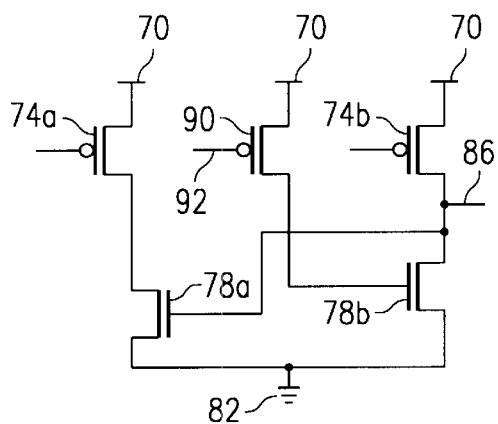
Figure 3C:
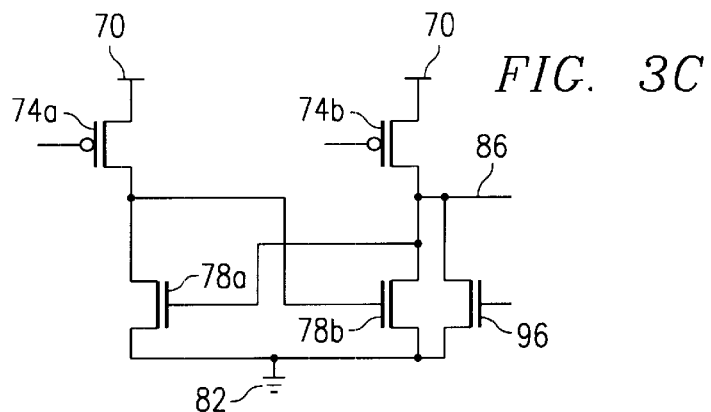

FIGS. 3A–C are schematic diagrams illustrating the mode selector 36 in accordance with alternative embodiments of the present invention. For these embodiments, the mode selector 36 comprises an on-chip detector for detecting whether or not the wordline voltage swing corresponds to a stable SRAM cell 10.

According to each of these embodiments, the mode selector 36 comprises a power supply, two p-channel transistors 74, two n-channel transistors 78, a ground 82 and an output terminal 86. The two p-channel transistors 74 are coupled to the power supply 70, the p-channel transistor 74a is coupled to the n-channel transistor 78a, and the p-channel transistor 74b is coupled to the n-channel transistor 78b. The p-channel transistor 74b and the n-channel transistor 78b are coupled to the output terminal 86, and the n-channel transistors 78 are coupled to ground 82.

For the embodiment shown in FIG. 3A, the p-channel transistor 74a is also coupled to gate of the n-channel transistor 78b, and the gate of the n-channel transistor 78a is coupled to ground. For the embodiment shown in FIG. 3B, the p-channel transistor 74b is also coupled to gate of the n-channel transistor 78a, and the gate of the n-channel transistor 78b is coupled to a p-channel transistor 90 which is coupled to the power supply 70. For the embodiment shown in FIG. 3C, the p-channel transistor 74a is also coupled to gate of the n-channel transistor 78b, the p-channel transistor 74b is also coupled to gate of the n-channel transistor 78a, and an n-channel transistor 96 is coupled in parallel with the n-channel transistor 78b.

For each of these embodiments, the output terminal 86 provides a reference potential that corresponds to the potential of the wordline 14 when the wordline 14 is low. If the output terminal 86 provides a potential that increases above a threshold level, the mode selector 36 determines that the SRAM cell 10 is unstable and provides a test mode signal to the driver 14 to place the wordline 14 in the test mode. Thus, the wordline voltage swing is limited, as described above in connection with FIGS. 1 and 2. However, if the output terminal 86 provides a potential at or below the threshold level, the mode selector 36 determines that the SRAM cell 10 is stable and provides a normal mode signal to the driver 14 to place the wordline 14 in the normal mode. Thus, a full wordline voltage swing is provided, as described above in connection with FIGS. 1 and 2.

Figure 4:
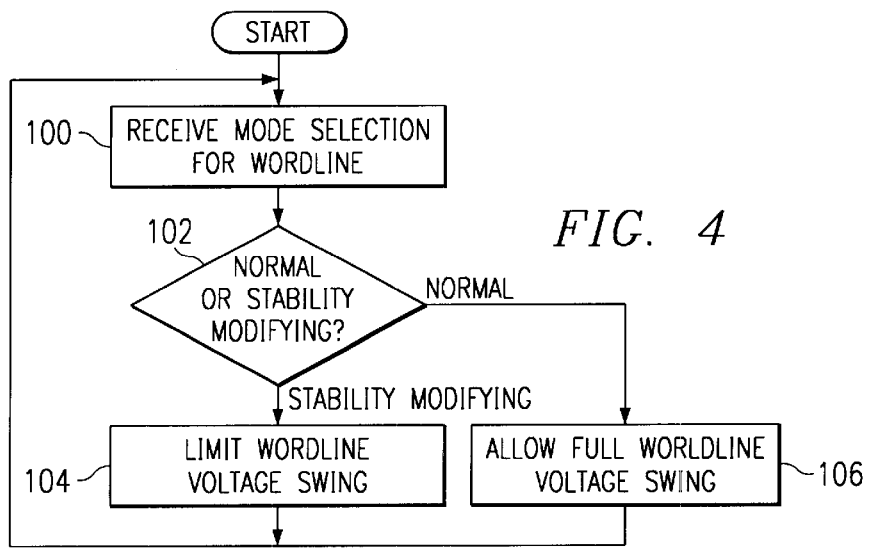
FIG. 4 is a flow diagram illustrating a method for providing stability for the SRAM cell of FIG. 1 in accordance with one embodiment of the present invention.

FIG. 4 is a flow diagram illustrating a method for providing stability for the SRAM cell 10 in accordance with one embodiment of the present invention. The method begins at step 100 where the mode selector 36 receives a mode selection for the wordline 14 from a source external to the SRAM cell 10.

At decisional step 102, the mode selector 36 determines whether the mode selection is normal mode or test mode. If the mode selector 36 determines that the mode selection is a test mode, the method follows the Test branch from decisional step 102 to step 104. At step 104, the mode selector 36 sends a test mode signal on line 44 to the driver 34 which limits the wordline voltage swing based on the test mode signal on line 44. The method then returns to step 100 where the mode selector 36 may receive another mode selection for the wordline 14.

Returning to decisional step 102, if the mode selector 36 determines that the mode selection is a normal mode, the method follows the Normal branch from decisional step 102 to step 106. At step 106, the mode selector 36 provides a normal mode signal on line 44 to the driver 34 which allows a full wordline voltage swing on the wordline 14 based on the normal mode signal on line 44. The method then returns to step 100 where the mode selector 36 may receive another mode selection for the wordline 14.

In this way, stability is ensured for the SRAM cell 10 during read operations regardless of the threshold voltages for the drive transistors 26 of the SRAM cell 10. Thus, high threshold voltage drive transistors 26 may be used to ensure data retention for the SRAM cell 10 without the stability of the SRAM cell 10 being adversely affected.

Figure 5:
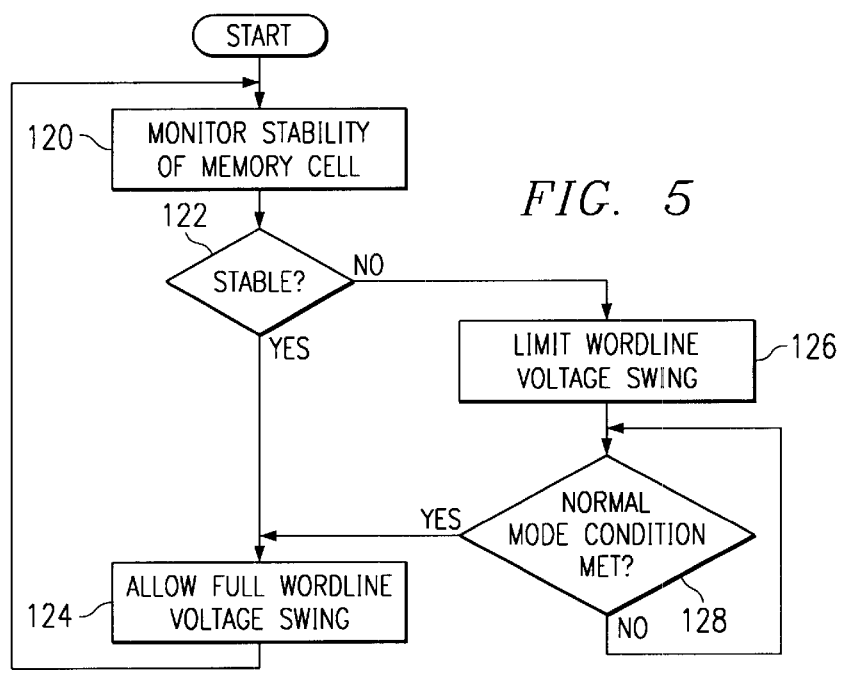
FIG. 5 is a flow diagram illustrating a method for providing stability for the SRAM cell of FIG. 1 in accordance with an alternative embodiment of the present invention.

FIG. 5 is a flow diagram illustrating a method for providing stability for the SRAM cell 10 in accordance with an alternative embodiment of the present invention. The method begins at step 120 where the mode selector 36 monitors the stability of the memory cell 10.

At decisional step 122, the mode selector 36 makes a determination regarding whether the SRAM cell 10 is stable. If the mode selector 36 determines that the SRAM cell 10 is stable, the method follows the Yes branch from decisional step 122 to step 124. At step 124, the mode selector 36 provides a normal mode signal on line 44 to the driver 34 which allows a full wordline voltage swing on the wordline 14 based on the normal mode signal on line 44. The method then returns to step 120 where the mode selector 36 continues to monitor the stability of the SRAM cell 10.

Returning to decisional step 122, if the mode selector 36 determines that the SRAM cell 10 is unstable, the method follows the No branch from decisional step 122 to step 126. At step 126, the mode selector 36 provides a test mode signal on line 44 to the driver 34 which limits the wordline voltage swing for the wordline 14 based on the test mode signal on line 44.

At decisional step 128, the mode selector 36 makes a determination regarding whether a normal mode condition has been met for the SRAM cell 10. If the mode selector 36 determines that the normal mode condition has not been met, the method follows the No branch from decisional step 128 and returns to decisional step 128 where the mode selector 36 continues monitoring the SRAM cell for the normal mode condition.

However, if the mode selector 36 determines that the normal mode condition has been met, the method follows the Yes branch from decisional step 128 to step 124 where the mode selector 36 provides the normal mode signal on line 44 to the driver 34 which allows a full wordline voltage swing on the wordline 14 based on the normal mode signal on line 44.

Thus, in this way as well, stability is ensured for the SRAM cell 10 during read operations regardless of the threshold voltages for the drive transistors 26 of the SRAM cell 10. Therefore, high threshold voltage drive transistors 26 may be used to ensure data retention for the SRAM cell 10 without the stability of the SRAM cell 10 being adversely affected.

Although the present invention has been described with several embodiments, various changes and modifications may be suggested to one skilled in the art. It is intended that the present invention encompass such changes and modifications as fall within the scope of the appended claims.

What is claimed is:

1. A system for providing stability for a low power static random access memory (SRAM) cell, comprising:

a wordline coupled to the SRAM cell, the wordline operable to select the SRAM cell for read and write operations when activated and to de-select the SRAM cell when de-activated;

a driver coupled to the wordline, the driver operable to activate and de-activate the wordline; and a mode selector coupled to the driver and operable to provide a mode signal to control the driver to place the wordline into one of a plurality of modes, one of said plurality of modes providing a limited wordline voltage swing to a specified level greater than reference potential.

2. The system of claim 1, the plurality of modes comprising a normal mode and a test mode.

3. The system of claim 2, the mode selector operable to place the wordline into the normal mode by providing a normal mode signal to the driver and to place the wordline into the test mode by providing a test mode signal to the driver.

4. A system for providing stability for a low power static random access memory (SRAM) cell, comprising:

a wordline coupled to the SRAM cell, the wordline operable to select the SRAM cell for read and write operations when activated and to de-select the SRAM cell when de-activated;

a driver coupled to the wordline, the driver operable to activate and de-activate the wordline; and a mode selector coupled to the driver, the mode selector operable to provide a mode signal to the driver to the place the wordline into one of a plurality of modes, the plurality of modes comprising a normal mode and a test mode;

the driver operable to provide a reference potential to the wordline when in the normal mode and to provide a pre-determined potential to the wordline when in the test mode, the pre-determined potential greater than the reference potential.

5. The system of claim 4, the driver comprising:
a p-channel transistor having a source coupled to a power supply, a gate coupled to an input terminal, and a drain coupled to an output terminal;
a first n-channel transistor having a gate coupled to the input terminal and a drain coupled to the output terminal;
a second n-channel transistor having a drain coupled to the source of the first n-channel transistor, a gate coupled to the source of the first n-channel transistor, and a source coupled to the reference potential; and
a third n-channel transistor having a drain coupled to the source of the first n-channel transistor, a gate coupled to the mode selector, and a source coupled to the reference potential.

6. The system of claim 5, the mode selector further operable to place the wordline in the normal mode by activating the third n-channel transistor and to place the wordline in the test mode by de-activating the third n-channel transistor.

7. The system of claim 4, the mode selector comprising:
a first p-channel transistor having a source coupled to a power supply, a gate coupled to an input terminal, and a drain coupled to an output terminal;
an n-channel transistor having a gate coupled to the input terminal and a drain coupled to the output terminal;
a second p-channel transistor having a source coupled to the source of the n-channel transistor, a gate coupled to a reference potential, and a drain coupled to the reference potential; and
a second n-channel transistor having a drain coupled to the source of the first n-channel transistor, a gate coupled to the mode selector, and a source coupled to the reference potential.

8. The system of claim 7, the mode selector further operable to place the wordline in the normal mode by activating the third n-channel transistor and to place the wordline in the test mode by de-activating the third n-channel transistor.

9. The system of claim 1, wherein the mode selector is operable to receive a mode selection for placing the wordline into the selected mode.

10. The system of claim 1, wherein the mode selector is operable to monitor a stability level for the SRAM cell and to place the wordline into a mode based on the stability level of the SRAM cell.

11. A method for providing stability for a low power static random access memory (SRAM) cell, comprising:
coupling a wordline to the SRAM cell, the wordline operable to select the SRAM cell for read and write operations when activated and to de-select the SRAM cell when de-activated;
coupling a driver to the wordline, the driver operable to activate and de-activate the wordline;
providing a mode selector coupled to the driver for providing a mode signal to control the driver to place the wordline into one of a plurality of modes, one of said plurality of modes providing limited wordline voltage swing to a specified level greater than reference potential;
receiving a mode selection for the mode selector;
providing a mode signal from the mode selector to the driver based on the received mode selection; and
placing the wordline into one of the plurality of modes based on the mode signal to the driver.

12. The method of claim 11, the plurality of modes comprising a normal mode and a test mode.

13. The method of claim 12, further comprising coupling a mode selector to the driver, the mode selector operable to receive the mode selection for the wordline and to provide the mode signal to the driver.

14. A method for providing stability for a low power static random access memory (SRAM) cell, comprising:
coupling a wordline to the SRAM cell, the wordline operable to select the SRAM cell for read and write operations when activated and to de-select the SRAM cell when de-activated;
coupling a driver to the wordline, the driver operable to activate and de-activate the wordline;
receiving a mode selection for the wordline;
providing a mode signal to the driver based on the received mode selection; and
placing the wordline into one of a plurality of modes based on the mode signal, the plurality of modes comprising a normal mode and a test mode;
the driver operable to provide a reference potential to the wordline when in the normal mode and to provide pre-determined potential to the wordline when in the test mode, the pre-determined potential greater than the reference potential.

15. A method for providing stability for a low power static random access memory (SRAM) cell, comprising:
coupling a wordline to the SRAM cell, the wordline operable to select the SRAM cell for read and write operations when activated and to de-select the SRAM cell when de-activated;
coupling a driver to the wordline, the driver operable to activate and de-activate the wordline;
receiving a mode selection for the wordline;
providing a mode signal to the driver based on the received mode selection; and
placing the wordline into one of a plurality of modes based on the mode signal, the plurality of modes comprising a normal mode and a test mode;
the driver operable to provide a reference potential to the wordline when in the normal mode and to provide pre-determined potential to the wordline when in the test mode, the pre-determined potential less than the reference potential.

16. A method for providing stability for a low power static random access memory (SRAM) cell, comprising the steps of:
providing an SRAM cell;
coupling a wordline to the SRAM cell, the wordline operable to select the SRAM cell for read and write operations when activated and to de-select the SRAM cell when de-activated;
coupling a driver to the wordline, the driver operable to activate and de-activate the wordline;
monitoring a stability level for the SRAM cell;
providing a mode selector for providing a mode signal to the driver for controlling [mode signal to] the driver based on the stability level for the SRAM cell; and
placing the wordline into one of a plurality of modes based on the mode signal.

17. The method of claim 16, the plurality of modes comprising a normal mode and a test mode.

18. The method of claim 17, further comprising coupling a mode selector to the driver, the mode selector operable to monitor the stability level for the SRAM cell and to provide the mode signal to the driver.

19. The method of claim 17, the driver operable to provide a reference potential to the wordline when in the normal mode and to provide a pre-determined potential to the wordline when in the test mode, the pre-determined potential greater than the reference potential.

20. The method of claim 17, the driver operable to provide a reference potential to the wordline when in the normal mode and to provide a pre-determined potential to the wordline when in the test mode, the pre-determined potential less than the reference potential.

* * * * *